United States Patent
Mishra et al.

(10) Patent No.: US 7,851,909 B2
(45) Date of Patent: Dec. 14, 2010

(54) GROUP III NITRIDE BASED FLIP-CHIP INTEGRATED CIRCUIT AND METHOD FOR FABRICATING

(75) Inventors: Umesh Mishra, Montecito, CA (US); Primit Parikh, Goleta, CA (US); Yifeng Wu, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/977,165

(22) Filed: Oct. 29, 2004

(65) Prior Publication Data

US 2005/0067716 A1    Mar. 31, 2005

Related U.S. Application Data

(63) Continuation-in-part of application No. 10/335,915, filed on Jan. 2, 2003, now Pat. No. 6,825,559.

(51) Int. Cl.
*H01L 23/34* (2006.01)
*H01L 23/48* (2006.01)

(52) U.S. Cl. .................. 257/728; 257/778; 257/724; 257/E23.169

(58) Field of Classification Search ............. 257/778, 257/724, 723, 728, 523, E23.169
See application file for complete search history.

(56) References Cited

U.S. PATENT DOCUMENTS

| | | | |
|---|---|---|---|
| 5,192,987 A | 3/1993 | Khan et al. | 257/183.1 |
| 5,614,743 A * | 3/1997 | Mochizuki | 257/276 |
| 5,949,140 A | 9/1999 | Nishi et al. | 237/728 |
| 6,362,525 B1 * | 3/2002 | Rahim | 257/738 |
| 6,384,701 B1 * | 5/2002 | Yamada et al. | 333/247 |
| 6,980,119 B2 | 12/2005 | Toulmin et al. | 340/815.45 |
| 7,057,279 B2 * | 6/2006 | Ogawa | 257/728 |

(Continued)

FOREIGN PATENT DOCUMENTS

CN    1175793 A    3/1998

(Continued)

OTHER PUBLICATIONS

Gaska et al. Hight Temperature Performance of AlGaN/GaN HFETs on SiC Substrates, IEE Electron Device Letters, vol. 18, No. 10, Oct. 1997, p. 492-494.

(Continued)

*Primary Examiner*—Nitin Parekh
(74) *Attorney, Agent, or Firm*—Koppel, Patrick, Heybl & Dawson

(57) ABSTRACT

A circuit substrate has one or more active components and a plurality of passive circuit elements on a first surface. An active semiconductor device has a substrate with layers of material and a plurality of terminals. The active semiconductor device is flip-chip mounted on the circuit substrate and at least one of the terminals of the device is electrically connected to an active component on the circuit substrate. The active components on the substrate and the flip-chip mounted active semiconductor device, in combination with passive circuit elements, form preamplifiers and an output amplifier respectively. In a power switching configuration, the circuit substrate has logic control circuits on a first surface. A semiconductor transistor flip-chip mounted on the circuit substrate is electrically connected to the control circuits on the first surface to thereby control the on and off switching of the flip-chip mounted device.

19 Claims, 9 Drawing Sheets

U.S. PATENT DOCUMENTS

| | | | |
|---|---|---|---|
| 7,202,608 B2 | 4/2007 | Robinson et al. | 315/224 |
| 7,489,086 B2 | 2/2009 | Miskin et al. | 315/185 R |
| 7,560,677 B2 | 7/2009 | Lyons et al. | 250/205 |
| 7,646,029 B2 | 1/2010 | Mueller et al. | 257/84 |
| 2001/0023964 A1 | 9/2001 | Wu et al. | |
| 2002/0017727 A1 | 2/2002 | Uemura | |
| 2003/0015756 A1* | 1/2003 | Farber et al. | 257/336 |
| 2003/0155661 A1* | 8/2003 | Auburger et al. | 257/778 |
| 2003/0165052 A1* | 9/2003 | Negishi et al. | 361/783 |
| 2003/0227357 A1* | 12/2003 | Metzger et al. | 333/189 |
| 2003/0234342 A1 | 12/2003 | Gaines et al. | |
| 2004/0075170 A1* | 4/2004 | Degani et al. | 257/724 |
| 2004/0245946 A1 | 12/2004 | Halter | |
| 2005/0012457 A1 | 1/2005 | Wu | |
| 2005/0104685 A1* | 5/2005 | Kuroki et al. | 333/133 |
| 2005/0167849 A1* | 8/2005 | Sato | 257/778 |
| 2006/0022214 A1 | 2/2006 | Morgan et al. | |
| 2007/0139316 A1 | 6/2007 | Hyatt | |

FOREIGN PATENT DOCUMENTS

| | | |
|---|---|---|
| CN | 1259764 A | 7/2000 |
| EP | 0 938 139 | 8/1999 |
| EP | 0938139 A | 8/1999 |
| GB | 2136203 A | 9/1984 |
| WO | WO 2004068909 | 8/2004 |

OTHER PUBLICATIONS

Wu et al., High Al Content AlGaN/GaN HEMTs With Very High Performance, IEDM-1999, Digest, Dec. 1999, pp. 925-927, Washington, D.C.

Lu et al., AlGaN/GaN HEMTs on SiC With Over 100GHs Pt and Low Microwave Noise, IEEE Transactions on Electron Devices, vol. 48, No. 3, Mar. 2001, p. 581-585.

Wu et al., Bias-Dependent Performance Of High-Power AlGaN/GaN HEMTs, IEEE, 2001.

CRC Press "The Electrical Engineering Handbook", $2^{nd}$ Edition, DORF, p. 994, (1997).

Wu Y-F et al, "Very-High Power Density AlGaN/GaN HEMTs", IEEE Transactions on Electron Devices, IEEE Inc. New York, US, vol. 48, No. 3, Mar. 2001, pp. 586-590, XP001039003. Section II "Device Technology", p. 586, Section III "Device Performance", p. 588, right column.

Wu Y-F et al, "14-W GaN-Based Microwave Power Amplifiers" Microwave Symposium Digest, 2000 IEEE MTT-S International Boston, MA, USA, Jun. 11-16, 2000, pp. 963-965, XP010507496, ISBN: 0-7803-5687-X, Section II "Device Technology", Section III "Circuit Design and Fabrication", p. 963-964.

J.J. Wierer et al., "High-Power AlGaInN Flip-Chip Light Emitting Diodes", Applied Physics Letters, vol. 78, No. 22, May 28, 2001, p. 3379-3381, XP002280202, p. 3380, left-hand column; fig. 1A, 1B.

Nguyen N X et al., "GaN/AlGaN MODFET With 80 GHs FMAXAND>100V Gate-Drain Breakdown Voltage", Electronics , IEE Stevenage, GB, vol. 33, No. 4, Feb. 13, 1997, pp. 334-335, XP006007044, ISSN:0013-5194. p. 332. left-hand fig. 1.

Wu Y-F et al., "GAN-Based FETS for Microwave Power Amplification" IEICE Transactions on Electronics, Institute of Electronics Information and Comm. Eng. Tokyo, JP, vol. E82-C, No. 11, Nov. 1999, p. 1895-1905, XP000931553.

Xu J J et al, "A 3-10 GHx LCR-Matched Power Amplifier Using Flip-Chip Mounted AlGaN/GaN HEMTs", Microwave Symposium Digest, 2000 IEEE, , MTT-S International Boston, MA, USA Jun. 11-16, 2000, Piscataway, NJ, USA, IEEE, US Jun. 11, 2000, p. 959-962, XP010507495.

Patent Abstracts of Japan, Publication No. 2000-244012, Publication Date: Sep. 8, 2000, Toyoda Gosei Co Ltd.

Patent Abstracts of Japan, Publication No. 11-330163, Publication Date: Nov. 30, 1999, Sharp Corp.

Patent Abstracts of Japan, Publication No. 2001-185561, Publication Date: Jul. 6, 2001, NEC Corp.

First Official Notice of Rejection Jun. 10, 2008.

Decision on Rejection re: related China Patent No. 200380110037.X, Dated: Jan. 2, 2009.

Related Official Notice of final Decision of Rejection, dated Nov. 4, 2008, re Japanese Patent Application No. 2004-565759.

Patent Abstracts of Japan, Publication No. 10-340978, Dated: Dec. 22, 1998.

Patent Abstracts of Japan, Publication No. 200-091381, Dated: Mar. 31, 2000.

Patent Abstracts of Japan, Publication No. 2001-358442, Dated: Dec. 26, 2001.

Related PCT International Search Report and Written Opinion, PCT/US2008/008528, dated: Jul. 16, 2009.

Second Office Action from related Chinese Application No. 200380110037X, dated: Jun. 5, 2009.

Khan et al. "AlGaN/GaN Metal-Oxide-Semiconductor Heterostructure Field-Effect Transistors on SiC Substrates", Applied Physics Letters, vol. 77, No. 9, pp. 1339-1341, Dated: Aug. 28, 2000.

Related Office Action from Taiwan Patent Application No. 092137492, dated May 25, 2009.

Third Office Action from related Chinese Application No. 200380110037.X, dated: Oct. 9, 2009.

Decision on Rejection from related Chinese Application No. 200380110037.X dated Feb. 12, 2010.

Office Action from related U.S. Appl. No. 10/335,915, dated: Dec. 3, 2003.

Response to related Office Action U.S. Appl. No. 10/335,915, dated: Mar. 3, 2004.

Office Action from related U.S. Appl. No. 10/335,915, dated: Jun. 10, 2004.

Response to related office action U.S. Appl. No. 10/335,915, dated: Jul. 8, 2004.

Notice of Allowance from related U.S. Appl. No. 10/335,915.

Office Action from U.S. Appl. No. 11/879,665, dated: Apr. 9, 2010.

Response to Office Action from U.S. Appl. No. 11/879,665, filed Jul. 7, 2010.

Wu, Yifeng, et al. IEEE Transaction on Electronic Devices, vol. 48, No. 3, Mar. 2001. "Very-High Power Density AlGaN/GaN HEMTs", pp. 586-590.

Patent Abstracts of Japan. Publication No. 2000-244012, Sep. 8, 2000. Toyoda Gosei Co Ltd. Kamimura Toshiya. "Manufacture of Group III Nitride Compound Semiconductor Element".

Patent Abstracts of Japan. Publication No. 11-330163, Nov. 11, 1999. Sharp Corp. Yamada Atsushi, et al. "Microwave-Millimeter Wave Device".

Patent Abstracts of Japan. Publication No. 2001-185561, Jul. 6, 2001. NEC Corp. Kono Junko, et al. "Semiconductor Device".

Notice Requesting Submission of Opinion from counterpart Korean Application No. 10-2005-7012520 mailed Jul. 14, 2010.

* cited by examiner

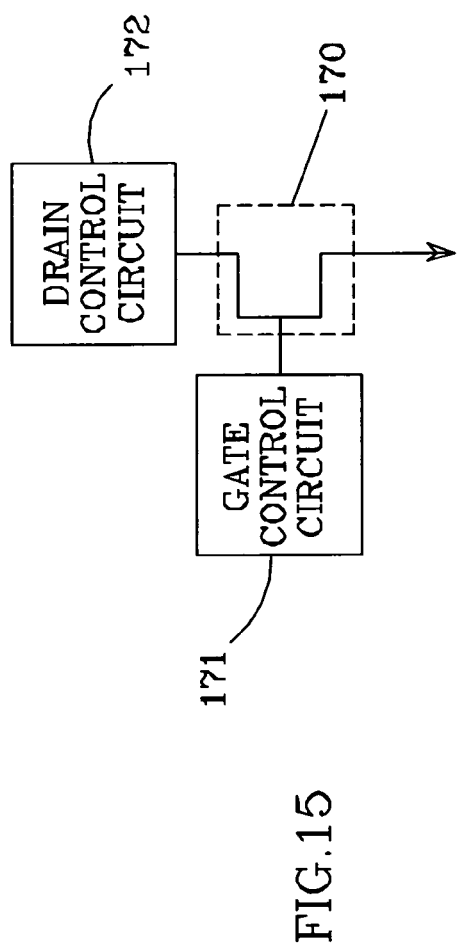

GROUP III NITRIDE BASED FLIP-CHIP INTEGRATED CIRCUIT AND METHOD FOR FABRICATING

RELATED APPLICATIONS

This is a continuation-in-part of application Ser. No. 10/335,915, filed Jan. 2, 2003 now U.S. Pat. No. 6,825,559.

BACKGROUND OF THE INVENTION

1. Field of the Invention

This invention relates to semiconductor devices, and more particularly to semiconductor devices that are flip-chip mounted on circuit substrates having passive components and/or active components.

2. Description of Related Art

Microwave systems commonly use solid state transistors as amplifiers and oscillators, which has resulted in significantly reduced system size and increased reliability. To accommodate the expanding number of microwave systems, there is an interest in increasing their operating frequency and power. Higher frequency signals can carry more information (bandwidth), allow for smaller antennas with very high gain, and provide radar with improved resolution.

Field effect transistors (FETs) and high electron mobility transistors (HEMTs) are common solid state transistors that can be fabricated from semiconductor materials such as silicon (Si) or gallium arsenide (GaAs). One disadvantage of Si is that it has low electron mobility (approximately 1450 cm2/V-s), which produces a high source resistance. This resistance seriously degrades the high performance gain otherwise possible from Si based FETs. [CRC Press, The Electrical Engineering Handbook, Second Edition, Dorf, p. 994, (1997)]

GaAs is also a common material for use in HEMTs and has become the standard for signal amplification in civil and military radar, handset cellular, and satellite communications. GaAs HEMTs have a higher electron mobility (approximately 6000 $cm^2$/V-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power.

Improvements in the manufacturing of Group-III nitride based semiconductor materials such as gallium nitride (GaN) and aluminum gallium nitride (AlGaN) has focused interest on the development of AlGaN/GaN based devices such as HEMTs. These devices can generate large amounts of power because of their unique combination of material characteristics including high breakdown fields, wide bandgaps (3.36 eV for GaN at room temperature), large conduction band offset, and high saturated electron drift velocity. The same size AlGaN/GaN amplifier can produce around ten times the power of a GaAs amplifier operating at the same frequency.

U.S. Pat. No. 5,192,987 to Khan et al. discloses AlGaN/GaN based HEMTs grown on a buffer and a substrate, and a method for producing a HEMT. Other HEMTs have been described by Gaska et al., "High-Temperature Performance of AlGaN/GaN HFET's on SiC Substrates," *IEEE Electron Device Letters*, Vol. 18, No 10, October 1997, Page 492; and Wu et al. "High Al-content AlGaN/GaN HEMTs With Very High Performance", *IEDM*-1999 Digest pp. 925-927, Washington D.C., December 1999. Some of these devices have shown a gain-bandwidth product ($f_T$) as high as 100 gigahertz (Lu et al. "AlGaN/GaN HEMTs on SiC With Over 100 GHz ft and Low Microwave Noise", *IEEE Transactions on Electron Devices*, Vol. 48, No. 3, March 2001, pp. 581-585) and high power densities up to 10 W/mm at X-band (Wu et al., "Bias-dependent Performance of High-Power AlGaN/GaN HEMTs", *IEDM*-2001, Washington D.C., Dec. 2-6, 2001)

Group-III nitride based semiconductor devices are often fabricated either on sapphire or SiC substrates. One disadvantage of sapphire substrates is that they have poor thermal conductivity and the total power output of devices formed on sapphire substrates can be limited by the substrate's thermal dissipation. Sapphire substrates are also difficult to etch. SiC substrates have higher thermal conductivity (3.5-5 w/cmk) but have the disadvantages of being relatively expensive and not available in large wafer diameters of 4-inch and greater. Typical semi-insulating SiC wafers are three inches in diameter and if the active layers of a transistor are formed on the wafer along with the passive components, interconnections, and/or pre-stage amplifiers, the yield in number of devices per wafer is relatively low. This reduced yield adds to the cost of fabricating Group III transistors on SiC substrates.

GaAs and Si semi-insulating wafers are available in larger diameters at a relatively low cost compared to the smaller diameter SiC wafers. GaAs and Si wafers are easier to etch and have low electrical conductivity. Another advantage of these wafers is that fabrication of semiconductor devices and other processing can be conducted at a commercial foundry, which can reduce cost. One disadvantage of these wafers is that they cannot be easily used as a substrate for Group-III nitride based devices because the lattice mismatch between the materials leads to poor quality semiconductor devices. Another disadvantage of these wafers is that they have low thermal conductivity.

In some instances GaAs semiconductor devices may not have the necessary operating characteristics. For example, a GaAs based multistage amplifier may not be able to provide the required output power levels. In such cases it may be desirable to fabricate a GaN based multistage amplifier. However, such an implementation has some disadvantages. First, the area required for a multi-stage MMIC with interstage networks and all the passive circuit elements is large. Expensive real estate on the GaN transistor substrate would be used up in hosting passive elements. Second, device and circuit models of GaN transistors are less established than their GaAs counterparts, thus making it difficult to accurately design and yield multistage GaN amplifiers that provide higher gain and power outputs.

SUMMARY OF THE INVENTION

A flip-chip integrated circuit according to the invention includes a circuit substrate having one or more active components and a plurality of passive circuit elements on a first surface. The circuit also includes an active semiconductor device comprising a substrate with layers of material and a plurality of terminals. Each of the terminals is in electrical contact with one of the layers of material. The active semiconductor device is flip-chip mounted on the circuit substrate and at least one of the terminals of the device is electrically connected to an active component on the circuit substrate.

In another configuration, a flip-chip integrated circuit includes a circuit substrate with amplifier electronics and passive circuit elements on a first surface and a semiconductor transistor that is flip-chip mounted on the circuit substrate. The flip-chip transistor is in electrical connection with passive circuit elements on the first surface. The flip-chip transistor, in combination with passive circuit elements, forms a flip-chip amplifier having an input electrically connected to the amplifier electronics.

Another flip-chip integrated circuit according to the invention includes a circuit substrate having control circuits on a first surface and a semiconductor transistor that is flip-chip mounted on the circuit substrate. Another control circuit configuration includes a Si based circuit substrate with control circuit elements on a first surface and a Group III nitride semiconductor transistor that is mounted on the circuit substrate. The transistor has a gate and a drain, at least one of which is electrically connected to one of the control circuit elements on the first surface. The circuit can be used for power switching applications In another flip-chip integrated circuit configuration, a circuit substrate including an insulating material, has passive circuit elements on a first surface. A Group III nitride active semiconductor device is flip-chip mounted on the circuit substrate and is electrically connected to the passive circuit element.

Another flip-chip integrated circuit according to the invention includes a circuit substrate having drive electronics on a first surface and conductive material on a second surface opposite the first surface. An active semiconductor device having a plurality of terminals on a first surface and a layer of material on a second surface opposite the first surface, is flip-chip mounted on the circuit substrate so that at least one of its terminals is in electrical contact with the drive electronics on the circuit substrate. The circuit further includes a first heat sink adjacent the conductive material on the circuit substrate and a second heat sink adjacent the layer of material on the active semiconductor device.

These and other further features and advantages of the invention would be apparent to those skilled in the art from the following detailed description, taking together with the accompanying drawings, in which:

BRIEF DESCRIPTION OF THE DRAWINGS

FIG. 15 is a schematic diagram of a power switching circuit; and

FIG. 16 is a sectional view of an integrated circuit according to the present invention including some of the components of the power switching circuitry of FIG. 15;

DETAILED DESCRIPTION OF THE INVENTION

Figure 1:
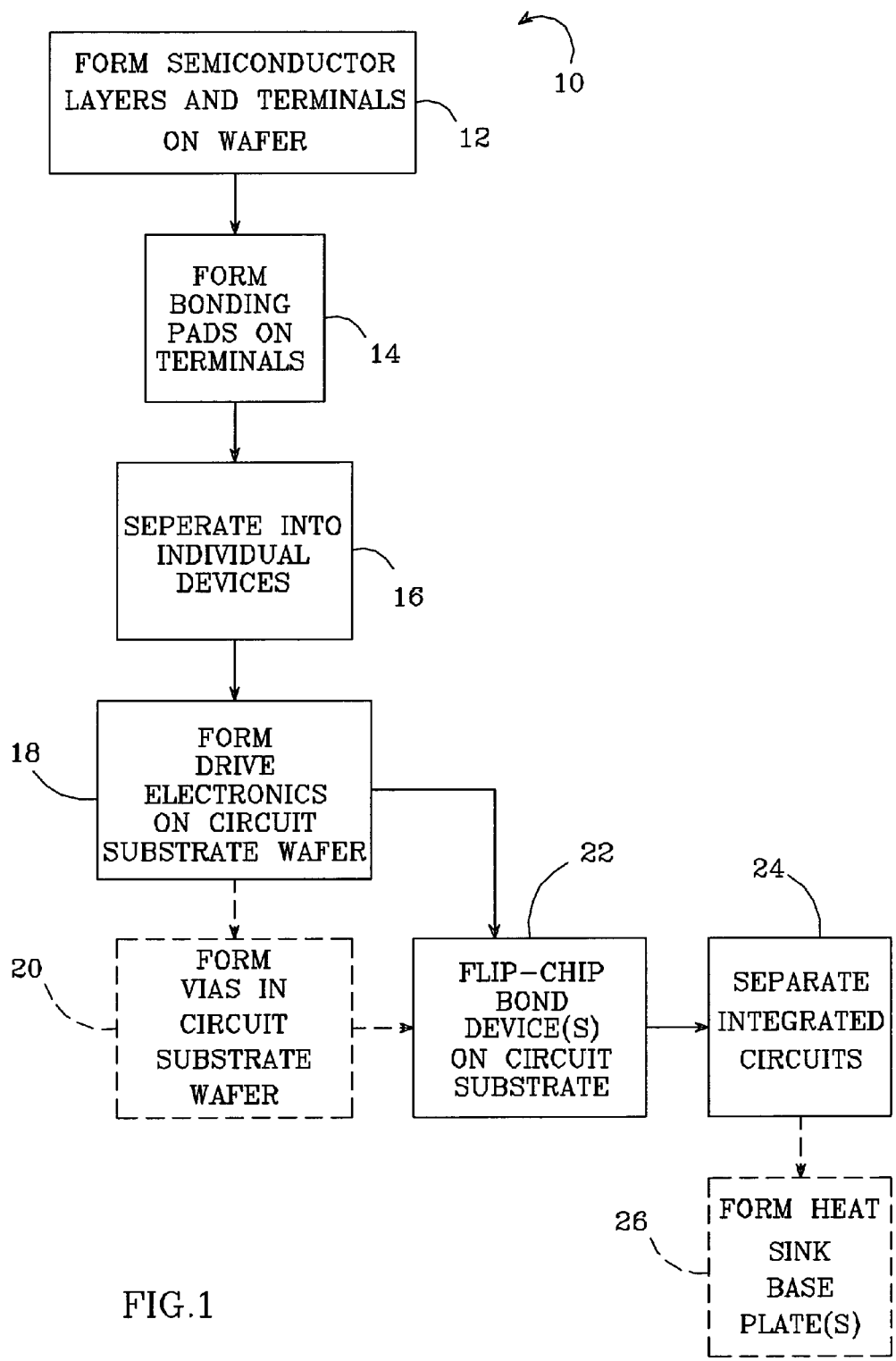
FIG. 1 is a flow diagram for a method of fabricating an integrated circuit according to the present invention.

FIG. 1 shows one embodiment of a method 10 according to the present invention. In the first step 12, semiconductor layers of a semiconductor device and device terminals are formed on a wafer. A preferred semiconductor device is a Group III nitride based device such as an AlGaN HEMT or FET grown on a sapphire, SiC, GaN, AlN or Si wafer, with the preferred wafer being a 4H polytype of SiC. Other SiC polytypes can also be used including 3C, 6H and 15R polytypes. An $Al_xGa_{1-x}N$ buffer layer (where x in between 0 and 1) can be included between the wafer and device active layers to provide an appropriate crystal structure transition between the SiC wafer (substrate) and the active layers.

Generally, SiC wafers are preferred over sapphire and Si because they have a much closer crystal lattice match to Group III nitrides, which results in Group III nitride films of higher quality. SiC also has a very high thermal conductivity, so the total output power of Group III nitride devices on SiC is not limited by the thermal resistance of the wafer (as is the case with some devices formed on sapphire or Si). Also, the availability of semi-insulating SiC wafers provides the capacity for device isolation and reduced parasitic capacitance that make commercial devices possible. SiC substrates are available from Cree Inc., of Durham, N.C. and methods for producing them are set forth in the scientific literature as well as in a U.S. Pat. Nos. Re. 34,861; 4,946,547; and 5,200,022. Other possible substrate materials include gallium nitride (GaN) and aluminum nitride (AlN).

The $Al_xGa_{1-x}N$ and other epitaxial layers can be deposited on the wafer using different epitaxial growth methods such as metalorganic chemical vapor deposition (MOCVD), plasma chemical vapor deposition (CVD) or hot-filament CVD or Molecular Beam Epitaxy (MBE). The terminals can be deposited on the active layers using sputtering, evaporation or plating, including other steps as necessary to complete device fabrication.

For a HEMT, the terminals include source and drain contacts that preferably comprise alloys of titanium, aluminum, nickel and gold, and a gate contact that preferably comprises titanium, platinum, chromium, nickel, gold, alloys of titanium and tungsten, and platinum silicide.

In step 14, bonding pads are formed on at least one of the device's terminals and the bond will contact the circuit substrate when the device is flip-chip mounted as described below. During typical operation of an AlGaN HEMT the drain contact is biased at a specified potential (positive drain potential for an n-channel device) and the source is grounded. For HEMTs, the bond pad is included on the source contact so it can be electrically connected to ground on the circuit substrate. The bonding pads are preferably made of a highly conductive material such as gold (Au) and they can be deposited using sputtering. Other materials can be used such as a solder bonding pad and bond pads can also be provided on other contacts of the HEMT as required.

In step 16 the active semiconductor devices on the wafer are separated into individual devices, preferably by dicing. Alternatively the devices can be separated by a scribe and break. If needed, parts of the wafer can also be separated instead of individual devices.

In step 18 drive electronics for driving one or more of the active semiconductor devices are formed on a circuit substrate wafer. The circuit substrate should be low cost, available in large diameters, easy to process, have low electrical conductivity and high thermal conductivity. GaAs and Si are suitable materials for the circuit substrate and have all of the desired characteristics except high thermal conductivity. Other suitable circuit substrate materials include SiC, indium phosphide (InP) and insulating materials such as aluminum nitride (AlN) and ceramic materials. The thermal conductivity of these materials can be improved by using conductive vias as described below. The drive electronics can comprise active components, passive components and interconnections in different combinations. In one such combination, the active components include transistors. These transistors, in combination with one or more of the passive components, may be interconnected to form a pre-stage amplifier. In another combination, the active components may form logic circuits.

The drive electronics form drive circuits for the flip-chip mounted active semiconductor devices. In embodiments including pre-stage amplifiers, the amplifiers are typically interconnected in series to amplify lower signals, thereby forming a multistage amplifier. After the pre-stage amplifiers amplify the signal, it can be applied to the flip-chip mounted semiconductor device for high power amplification. In this configuration, the flip-chip mounted semiconductor device is a transistor that is electrically connected to passive components on the circuit substrate to form an amplifier. Pre-stage amplifiers are not needed in embodiments where the flip-chip mounted device can be driven by passive components and interconnects without pre-stage amplification. The active components, passive components and interconnections can be deposited on the circuit substrate using a commercial foundry process, which helps reduce manufacturing costs.

A different number of active devices can be driven by the drive electronics. In one embodiment, a single drive electronics circuit can drive a single active device. In other embodiments, a drive circuit can drive more than one active device or one active device can be driven by more than one drive electronics circuit.

The passive components can include, but are not limited to, resisters, capacitors and inductors, and the interconnections can comprise traces of conductive material or transmission line network elements on the circuit substrate. The active components and passive components can be formed using MOCVD, CVD or hot-filament CVD, MBE and the traces can be formed using sputtering or electron beam deposition or plating.

In alternative step 20, one or more conductive vias are formed through the circuit substrate, with each of the drive circuits utilizing at least one conductive via. In one embodiment according to the invention, the vias form a conductive path to ground for an active semiconductor device that is flip-chip mounted to one of the drive circuits as described below; they also promote the device's heat dissipation. Different methods can be used for forming the vias, including but not limited to forming a hole through the circuit substrate using wet chemical HF etching, RIE, ICP or plasma etching. The inside surface of the vias can then be covered with a layer of conductive material, preferably gold (Au), which can be deposited using sputtering. In still another embodiment, the top of the conductive vias can include a plug of conductive material to enhance heat dissipation.

In another embodiment of a method according to the present invention, the circuit substrate for active flip-chip devices can operate without the path through the substrate. As a result, the device does not include conductive vias or a plug. The device can be connected to ground through other paths, such as through a coplanar waveguide arrangement including interconnects on the circuit substrate. Heat can be extracted from the device in other ways, such as through a heat sink attached to the back of the device.

In step 22, the active semiconductor device is flip-chip mounted on the circuit substrate having the Au bond pad in electrical contact with the Au in the vias, in an Au—Au flip-chip bond. Alternatively, conventional bump bonding based on Au or solder can be used. For an AlGaN HEMT, the Au bond on the source contact is in electrical contact with the vias. The gate and drain contacts can then be electrically bonded to the drive electronics on the circuit substrate, with the gate typically connected to the input side and the drain connected to the output side of the drive electronics.

In step 24 the drive electronic circuits and active devices on the circuit substrate are separated into individual integrated circuits. This can be accomplished by the same methods described above that are used to separate the active devices or regions of active devices.

In another alternative step 26, one or more heat sink base plates can be formed on the integrated circuit (before or after being separated), with the base plates then being connected to one or more heat sinks. Heat from the active device and circuit substrate flows into the base plates and then into the heat sink, where it dissipates. The base plates can be arranged in many different ways, including but not limited to, adjacent to the active device and/or the circuit substrate.

Methods according to the present invention can be used to fabricate many different devices beyond AlGaN HEMTs. The different steps of the methods can also be accomplished using different processes and the steps of the methods can be taken in different order.

Figure 2:
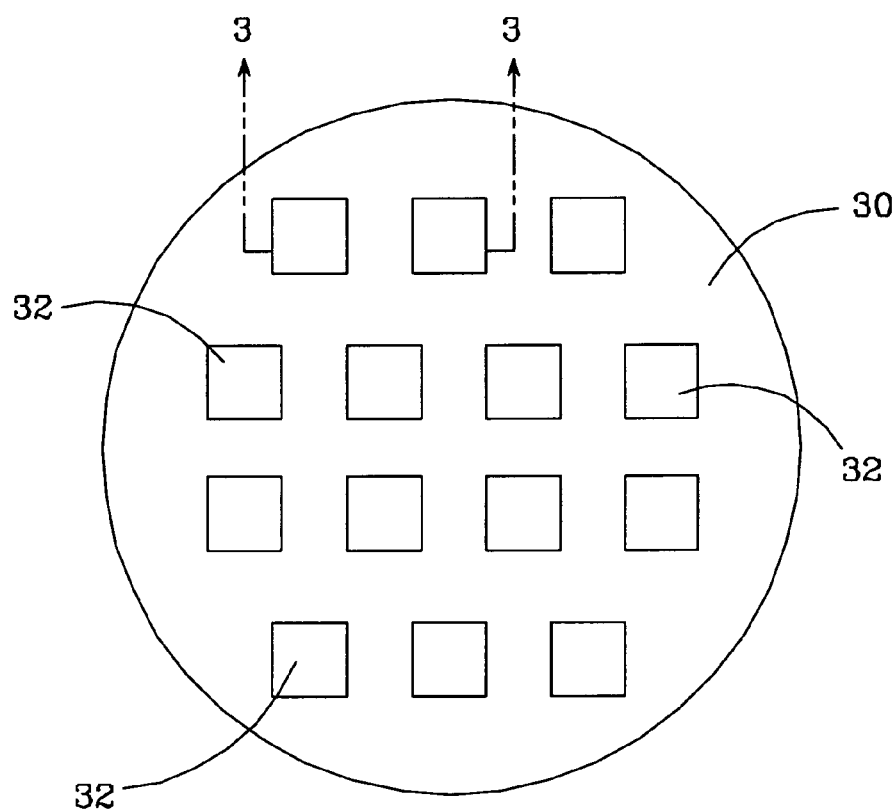
FIG. 2 is a plan view of a SiC wafer according to the present invention, with AlGaN/GaN HEMTS formed on it.

The present invention also discloses an active semiconductor device that is flip-chip mounted on a circuit substrate having active components and/or passive components and interconnections. FIG. 2 shows a typical semi insulating SiC wafer 30 that is available in different diameters, including approximately two or three inches. The device active layers and terminals 32, shown as squares on the wafer 30, are deposited on the wafer 30 using the methods described above. The illustration is only a representation of the number of devices that can be formed on a wafer. The preferred device active layers and terminals 32 form an AlGaN HEMT and for a typical 2-inch wafer with 10-Watt HEMTs, approximately 2000 HEMTs can be formed on the wafer. If the passive components or pre-stage amplifiers were formed on the wafer with the HEMT, only approximately 200 devices could be formed.

Figure 3:
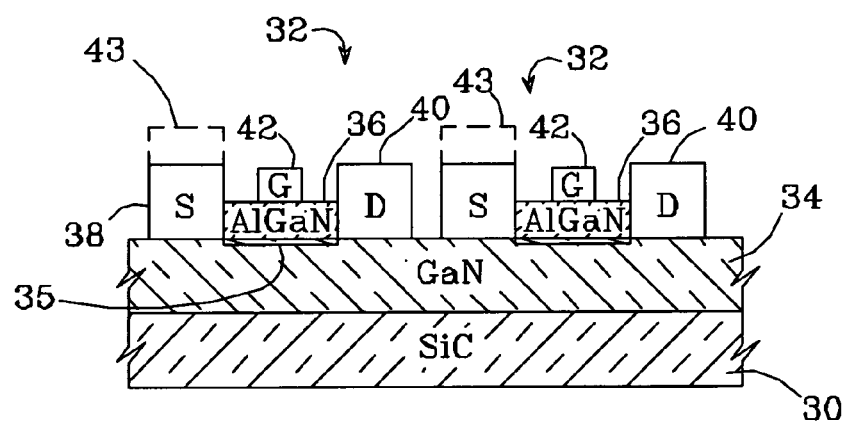
FIG. 3 is a sectional view of two of the AlGaN/GaN HEMTs formed on the wafer shown in FIG. 2.

FIG. 3 shows a sectional view of two of the AlGaN/GaN based HEMTs 32 formed on the wafer 30 according to the present invention. When the HEMTs 32 are separated into individual devices, the portions of the wafer 30 that remain with each HEMT serve as the HEMT's substrate. An $Al_xGa_{1-x}N$ buffer layer (where x in between 0 and 1) (not shown) can be included between the wafer and device active layers to provide the desired crystal structure transition between the wafer and the active layers.

A GaN high resistivity layer 34 is deposited on the wafer 30 and a AlGaN barrier layer 36 is deposited on the high resistivity layer 34. The high resistivity layer 34 is typically about 0.5 to 4 micrometers thick and the barrier layer 36 is typically about 10 to 40 nm thick.

To provide separation between the individual HEMTS and to provide a location for the source and drain contacts 38, 40, the barrier layer 36 is etched to the high resistivity layer 34. The source and drain contacts 38, 40 are deposited on the surface of the high resistivity layer 34 with the barrier layer 36 disposed between them. Each of the contacts 38, 40 are in electrical contact with the edge of the barrier layer 36.

The contacts 38, 40 are usually separated by a distance in the range 1.5 to 5 micrometers for microwave devices, but could be 1 to 10 micrometers in special cases. A rectifying Schottky contact (gate) 42 is located on the surface of the barrier layer 36 between the source and drain contacts 38, 40, and it typically has a length in the range of 0.1 to 2 micrometers. The total width of the HEMT 32 depends on the total power required. It can be wider than 30 millimeters, with the typical width being in the range of 100 microns to 6 millimeters.

The barrier layer 36 has a wider bandgap than the GaN layer 34 and this discontinuity in energy band gaps results in a free charge transfer from the wider band gap to the lower band gap material. Furthermore, in the Group III-Nitride system, piezoelectric and spontaneous polarization results in a significantly higher charge density. A charge accumulates at the interface between the two layers and creates a two dimensional electron gas (2DEG) 35 that allows current to flow between the source and drain contacts 38, 40. The 2DEG 35 has very high electron mobility which gives the HEMT a very high transconductance. An AlN spacer/barrier may also be included between the AlGaN layer and the GaN high resistivity layer, as disclosed in patent application Publication No. U.S. 2002/0167023 A1.

During operation, the drain contact 40 is biased at a specified potential (positive drain potential for an n-channel device) and the source is grounded. This causes current to flow through the channel and 2DEG, from the drain to the source contacts 38, 40. The flow of current is controlled by the bias and frequency potentials applied to the gate 42, which modulate the channel current and provide gain. The voltage applied to the gate 42 electrostatically controls the number of electrons in the 2DEG directly under the gate 42, and thus controls the total electron flow.

Figure 4:
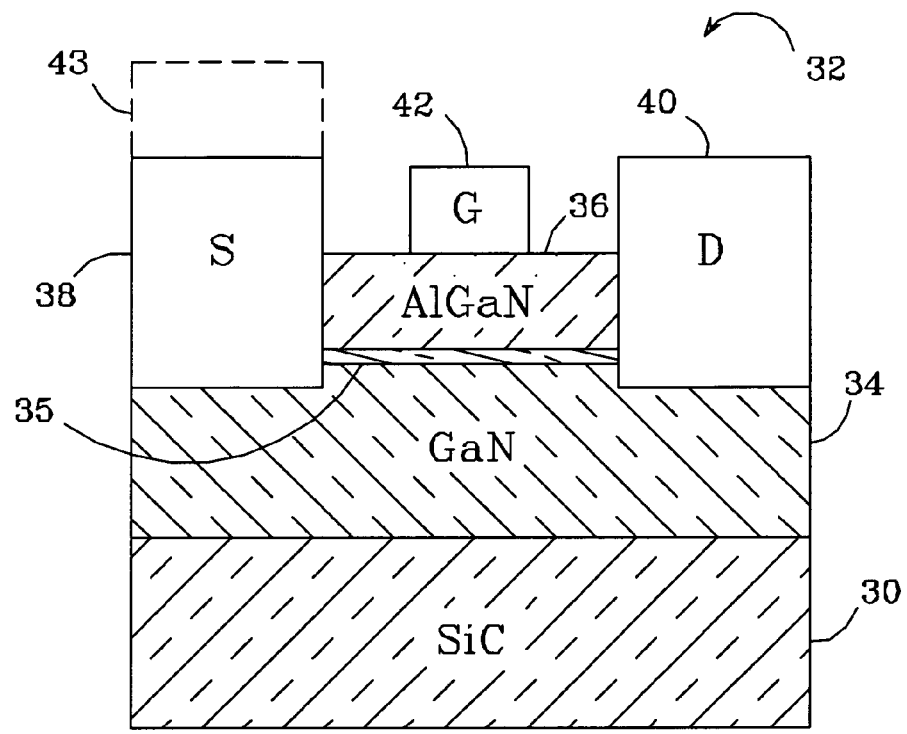
FIG. 4, is a sectional of an individual HEMT separated from the other HEMTs on the wafer of FIG. 2.

A bonding pad 43 is also included on the source contact 38 for flip-chip bonding to the circuit substrate as described below. When the HEMTs 32 on the wafer 30 are separated into individual HEMTs, portions of the GaN layer 34 and SiC wafer 30 between the HEMTs are removed leaving individual devices as shown in FIG. 4. In alternative configurations, the wafer 30 upon which the device active layers and terminals 32 are deposited may be formed from other semi-insulating materials such as sapphire, Si or GaN. The wafer 30 may also be formed from an insulating material such as AlN or a ceramic material.

Figure 5:
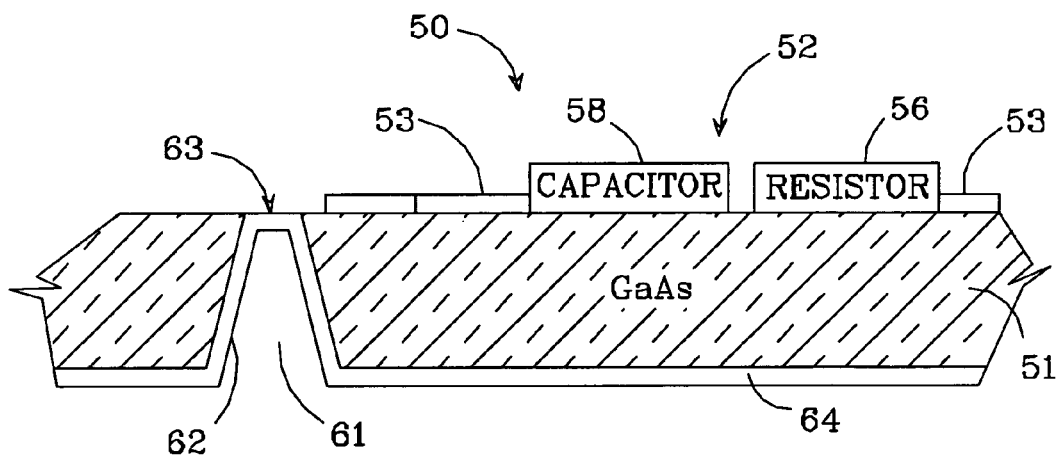
FIG. 5 is a sectional view of a circuit substrate according to the present invention.

FIGS. 5-8 show different embodiments of circuit substrates according to the present invention, although other circuit substrates can also be used. FIG. 5 shows a circuit substrate 50 according to the present invention, which includes a wafer 51 that can be made of many different materials including GaAs. The wafer 51 has passive components 52 and interconnects 53 deposited on its top surface. The wafer 51 can have many different thicknesses, with a suitable thickness being in the range of 50 to 500 micrometers. Wafers of other material can also be used, including Si, SiC, InP, AlN and ceramic, with the preferred wafers being easy to process, having low electrical conductivity and/or having high thermal conductivity.

Different passive components can be used including resistors 56 or capacitors 58, and the interconnects 53 can be conductive traces 60. The passive components 52 and the interconnects 53 together serve as the drive electronics and matching circuit for an active device that is flip-chip mounted on substrate 50 (as described below). The substrate 50 can have drive electronics for more than one active device and the passive components 52 and traces can be formed using the methods as described above in the method of FIG. 1.

A hole 61 is formed through the GaAs wafer 51, and the inside surface and top opening of the hole is covered with a layer 62 of material having high electrical and thermal conductivity. The layer 62 forms a conductive via 63 through the wafer 51. The bottom surface of the wafer 51 can also be covered with a layer of material 64 having high electrical and thermal conductivity, with the preferred material for the layers 62 and 64 being Au. Electrical current and heat pass through the layer 62 and are spread into layer 64. The layers 62 and 64 together serve as the electrical contact to ground for a device that is flip-chip mounted on the substrate 50. They also help dissipate heat from the flip-chip mounted device. This is particularly useful for GaAs and Si substrates that have relatively low thermal conductivity. Generally, the larger the vias 63, the more efficient the circuit substrate 50 is at dissipating heat if the circuit substrate does not have higher thermal conductivity than the material in the vias. Typical vias are 50-100 microns wide, but wider or narrower vias can be used.

Figure 6:
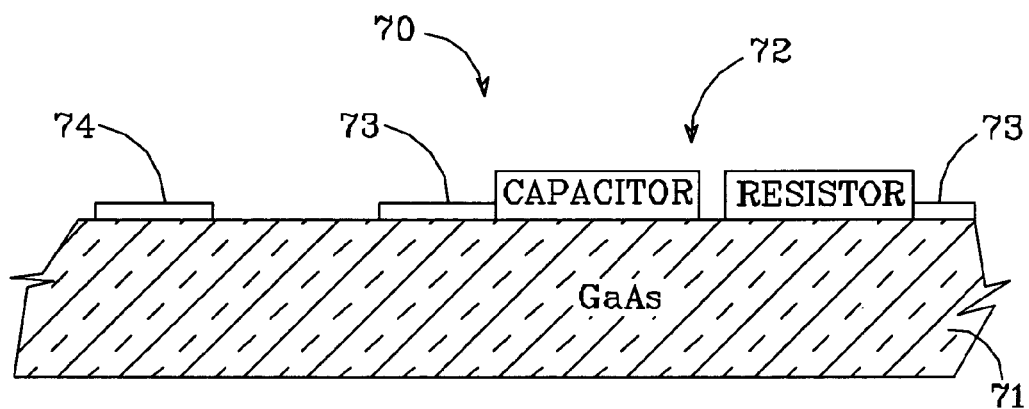
FIG. 6 is a sectional view of a second circuit substrate according to the present invention.

FIG. 6 shows a circuit substrate 70 according to the present invention, which includes a GaAs wafer 71 that is similar to the wafer 51 in FIG. 5, and can be made of the same materials. The wafer 71 has passive components 72 and interconnects 73 deposited on its top surface to form drive electronics. However, the wafer 71 does not have a hole, a conductive via, or a conductive layer on its bottom surface. Instead, to provide a conductive path to ground a conductive trace 74 is included on the surface of the wafer 71. Devices can be flip-chip mounted on the wafer 71 with the device ground connection to the trace 74, such that a conductive path through the wafer 71 for ground or heat dissipation is not needed.

Figure 7:
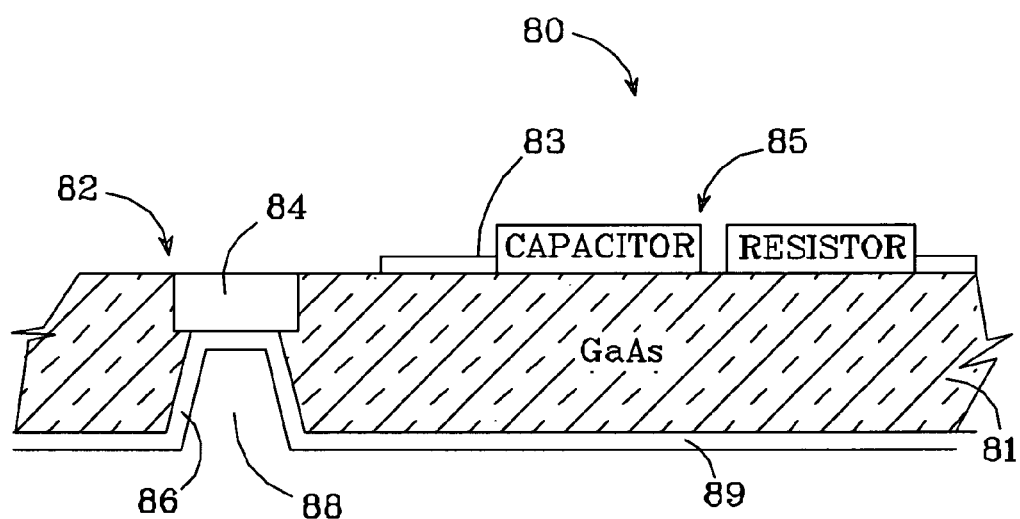
FIG. 7 is a sectional view of a third circuit substrate according to the present invention.

FIG. 7 shows a circuit substrate 80 according to the present invention that is similar to the circuit substrate 50. It includes a wafer 81 and a conductive via 82 formed in the hole 88. However, in substrate 80 a plug 84 of material with high electrical and thermal conductivity is included. The plug 84 is at the top of the hole 88, with the plug's top surface at the top surface of the wafer 81. The via's layer 86 covers the inside of the hole 88 and the bottom surface of the plug 84. The plug 84 is preferably made of gold (Au) and allows the substrate 80 to more efficiently conduct heat away from the flip-chip device mounted on it. The substrate 80 also includes passive components 85, interconnects 83, and bottom conductive layer 89.

Figure 8:
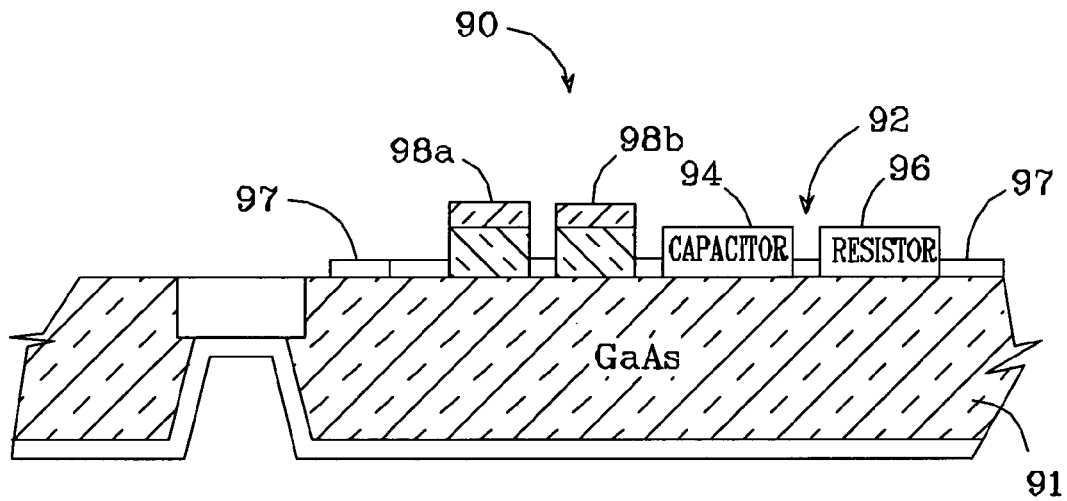
FIG. 8 is a sectional view of a fourth circuit substrate according to the present invention.

FIG. 8 shows another embodiment of a circuit substrate 90 according to the present invention that includes a wafer 91, and passive components 92 that can include but are not limited to a capacitor 94, resistor 96 and interconnects 97. In addition, the substrate 90 has pre-stage amplifiers 98a and 98b that can be made of many material systems including InGaAs and InP. The amplifiers 98a, 98b serve as pre-stages of amplification are typically connected in series to amplify lower signals. After the pre-stage amplifiers 98a, 98b amplify the signal, it is applied to the amplifier flip-chip mounted on the substrate 90, for high power amplification. The pre-stage amplifiers 98a, 98b are preferably HEMTs and 2 to 3 pre-stage amplifiers are typically used, although more or less could also be used. As outlined above, the pre-stage amplifiers 98a, 98b are formed by a transistor and passive components 92, each of which can be fabricated on the circuit substrate 91 using a commercial foundry.

A circuit substrate according to the present invention can have any combination of the substrate features shown in FIGS. 5-8. For instance, the substrate can have pre-stage amplifiers without vias, or if the substrate has vias, the vias can be used without a plug. Accordingly, there are many additional embodiments of the circuit substrate according to the present invention beyond those described above.

Figure 9:
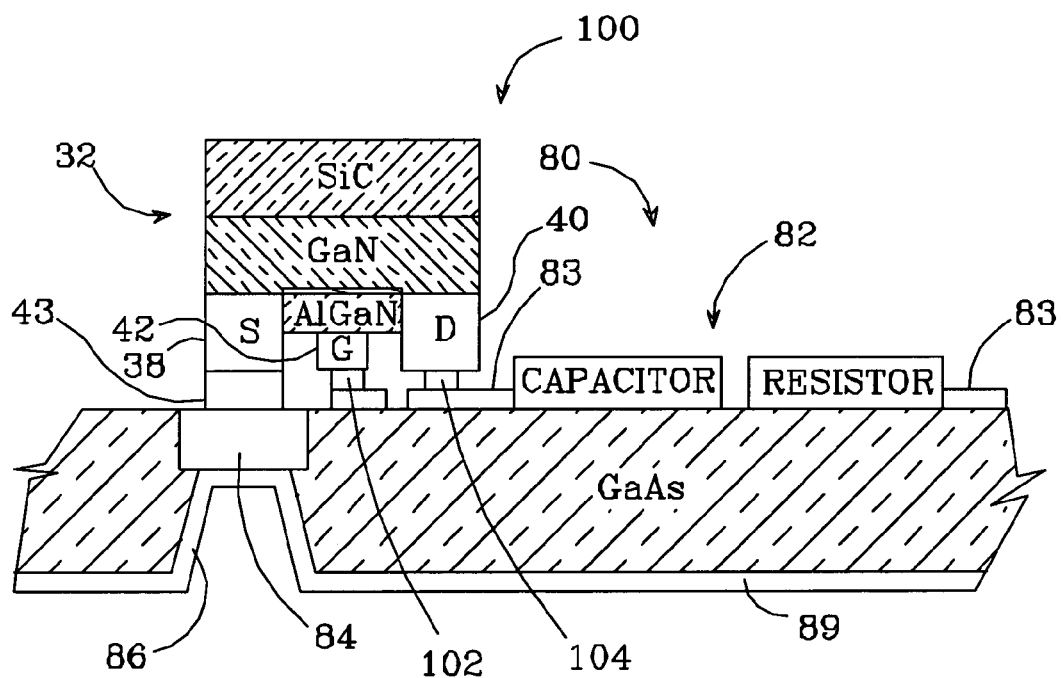
FIG. 9 is a sectional view of an integrated circuit according to the present invention with the circuit substrate having a HEMT flip-chip mounted to it.

FIG. 9 shows a flip-chip integrated circuit (IC) assembly 100 according to the present invention, having the HEMT 32 of FIG. 4 flip-chip mounted on the circuit substrate 80 of FIG. 7, although the HEMT 32 can also be flip-chip mounted on the circuit substrates 50, 70 and 90 in FIGS. 5, 6 and 8. The same reference numerals from FIGS. 4 and 7 are used for the same features.

The HEMT's bonding pad 43 on the source contact 38 is bonded to the surface of the circuit substrate 80 with the bonding pad 43 over the plug 84. The bonding pad 43 is bonded in electrical and thermal contact with the plug 84. The layer 89 serves as the integrated circuit's ground and the source contact 38 is connected to layer 89 through the plug 84 and via layer 86. Heat also flows to the layer 89 from the HEMT 32 through the plug 84 and via layer 86. The drain 40 and gate 42 are connected to the passive components 82 through conductive connections 102, 104 and interconnects 83 on the circuit substrate 80. By flip-chip mounting as shown in FIG. 9, integrated circuits 100 can be manufactured at lower cost with higher yield.

Figure 10:
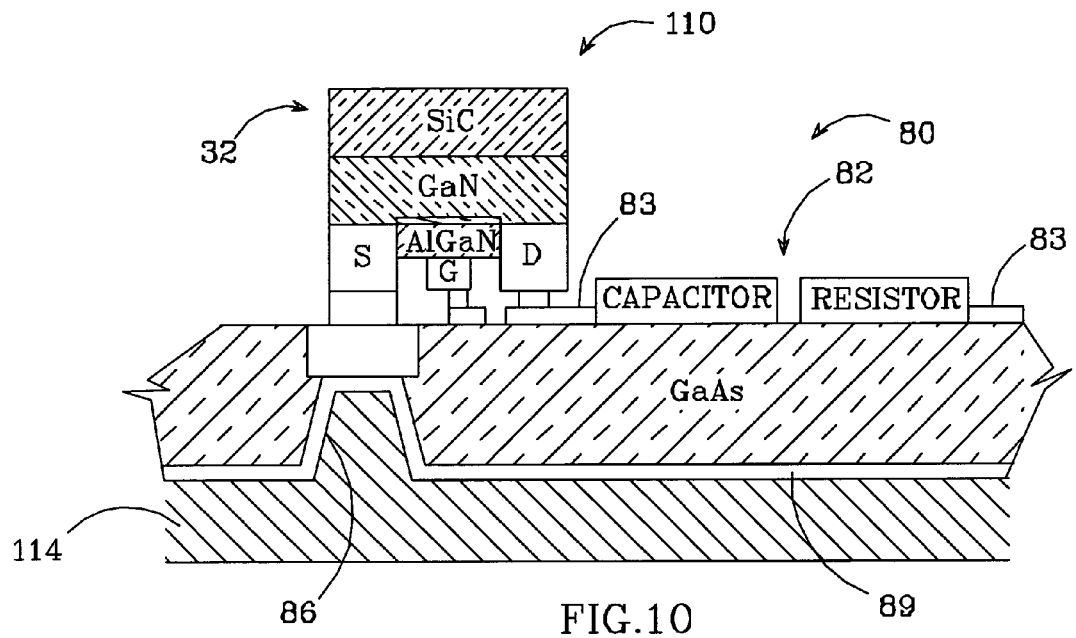
FIG. 10 is a sectional view of the device in FIG. 8 with a first heat sink root on the bottom surface of the circuit substrate.

FIG. 10 shows an IC assembly 110 that is similar to the integrated circuit 100 in FIG. 9, but has improved heat dissipation characteristics. It has the same HEMT device 32 that is flip-chip mounted to a circuit substrate 80 having passive components 82 and interconnects 83. A first heat sink base plate 114 is disposed adjacent to the conductive layers 86 and 89, with heat from the layers flowing into the first base plate 114. Heat from the first base plate 114 then flows into an external heat sink (not shown) where it is dissipated. The base plate 114 and heat sink should be made of a thermally conductive material that conducts heat away from the substrate 80 and the HEMT 32, with suitable materials being Cu, Cu—W, Cu—Mo—Cu composites, AlN, diamond or other conventional heat sink materials. The base plate 114 and heat sink help keep the HEMT 32 from overheating at higher power levels. The base plate 114 can also be used with a circuit substrate that does not have a conductive plug.

Figure 11:
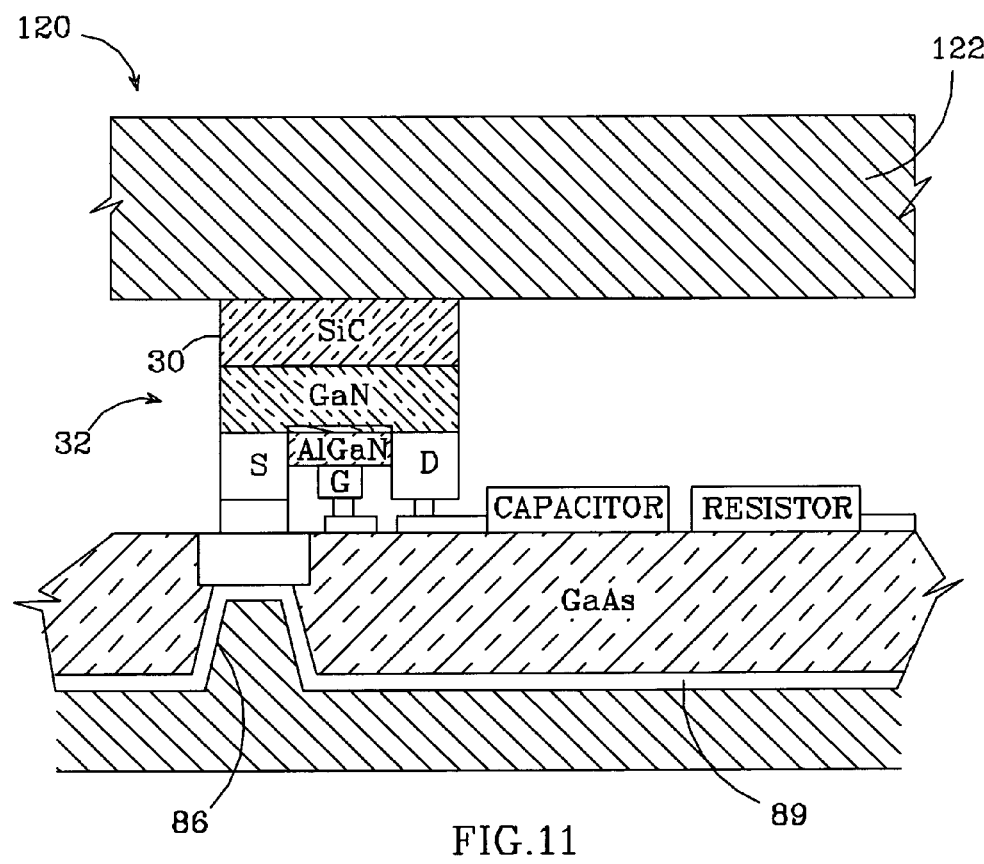
FIG. 11 is a sectional view of the device in FIG. 9 with a second heat sink root adjacent to the substrate of the HEMT.

FIG. 11 shows another IC assembly 120 according to the present invention that is similar to the IC assembly 110 in FIG. 10, but includes additional heat dissipation features. The IC assembly 120 has a HEMT 32 flip-chip mounted on a circuit substrate 80 that has the same first base plate 114 as the circuit 110 in FIG. 10. To improve heat dissipation through the HEMT's substrate 30, the IC assembly 120 also has a second heat sink base plate 122 arranged adjacent to the SiC substrate 30. The second base plate 122 is coupled to a second heat sink (not shown), which provides another path for heat from the HEMT 32 to dissipate. The second base plate 122 and second heat sink can be made of the same or different materials as the first base plate 114 and heat sink, but should be made of a heat conductive material. The second base plate 122 can also be used with a HEMT that is flip-chip mounted on circuit substrates that does not have a plug 84. It can also be used in an IC assembly that does not have a first heat sink, although the most efficient heat dissipation is provided by using first and second base plates 114, 122 with their respective heat sinks. In other embodiments of the invention, the second base plate 122 can be the primary path for heat dissipation and/or the first base plate 114 can be simplified or omitted. To compensate for thermal expansion of the IC assembly 120, the first or second base plates 114, 122 can be connected to a thermally conductive, encapsulation instead of a heat sink, with the encapsulation being somewhat resilient or flexible.

Figure 12:
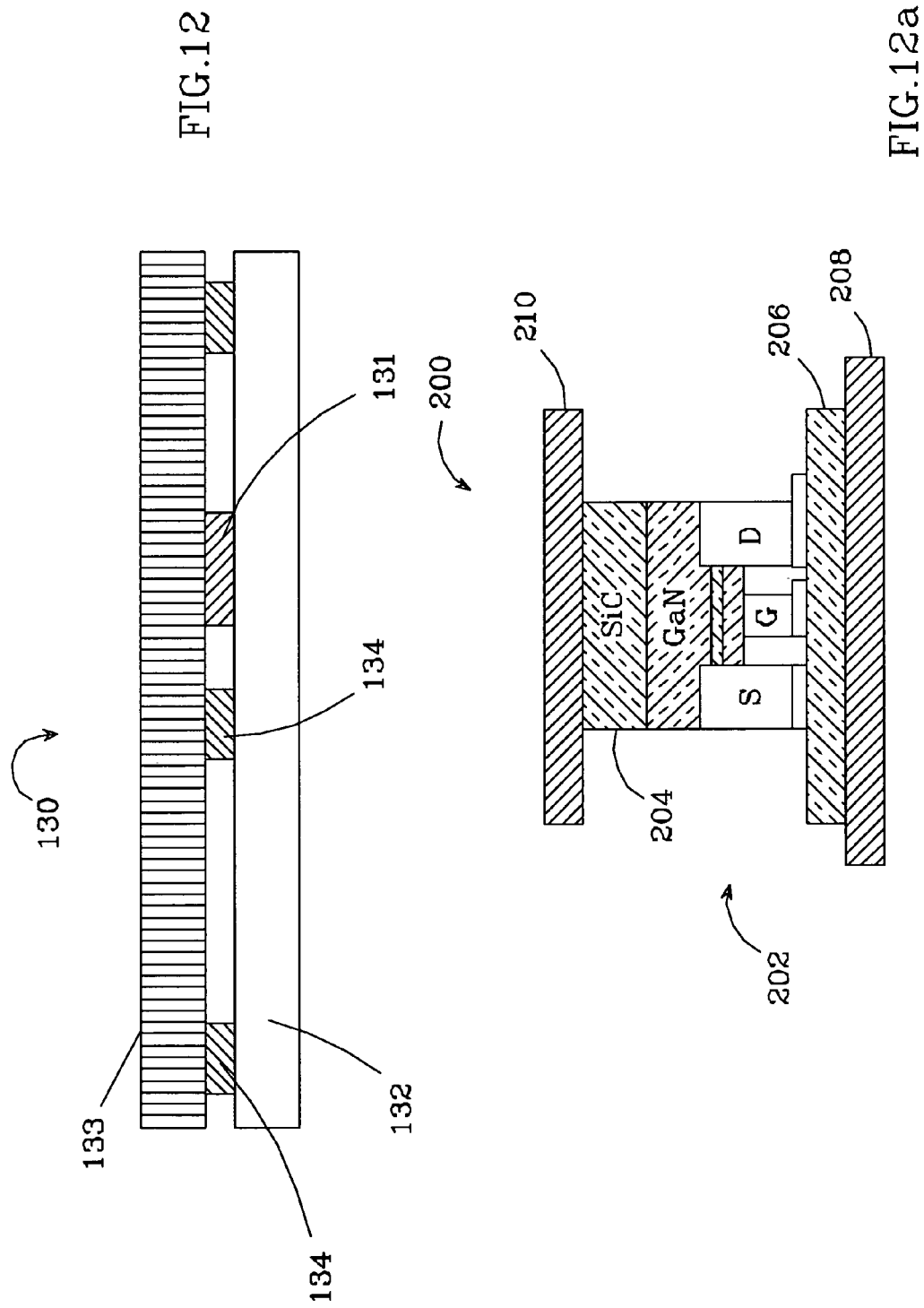
FIG. 12 is a sectional view of another integrated circuit according to the present invention with a flip-chip mounted HEMT and second heat sink root.

FIG. 12 shows an IC assembly 130 according to the present invention having a flip-chip mounted GaN HEMT 131 mounted on a circuit substrate 132. Passive components, pre-stage amplifiers and interconnects (not shown) can be included on the substrate 132. A top heat sink base plate 133 is included on the HEMT 131, with the base plate 133 also mounted to the substrate 132 by spacers 134 that can be dummy chips or solder bumps. The spacers 134 arrangement holds the heat sink base plate 133 adjacent to the HEMT 131 while providing a stable attachment of the base plate 133 to the substrate 132.

FIG. 12a shows a semiconductor assembly 200 having dual heat dissipation capabilities. The assembly includes an active semiconductor device 202, such as a GaN or SiC transistor similar to those described above. The semiconductor device 202 includes a gate terminal G, source terminal S and a drain terminal D on a first surface and a layer of thermally conductive material 204 on a second surface opposite the first surface. The transistor 202 is flip chip mounted on what is effectively a thermally conductive substrate 206. This thermally conductive substrate 206 may include, for example, a GaAs material with vias as shown in FIG. 5, a GaAs material with vias and plugs as shown in FIG. 7 or a material having high thermal conductivity, such as SiC, InP, AlN or ceramic. The use of a high thermal conductivity material may reduce or eliminate the use of vias. A first heat sink 208 is arranged adjacent the thermally conductive substrate 206 while a second heat sink 210 is adjacent the layer of thermally conductive material 204 portion of the transistor.

The heat sinks used in any of the assemblies described in FIGS. 10-12a, may be made from any high thermal conductivity material. Examples of such materials include metals, such as aluminum and copper; inorganic materials, such as carbon and ceramics; and composite materials. The heat sinks may also be formed using porous configurations of any of these materials. One such material is Durocel™ porous aluminum foam which is available from ERG Material and Aerospace Corporation.

Figure 13:
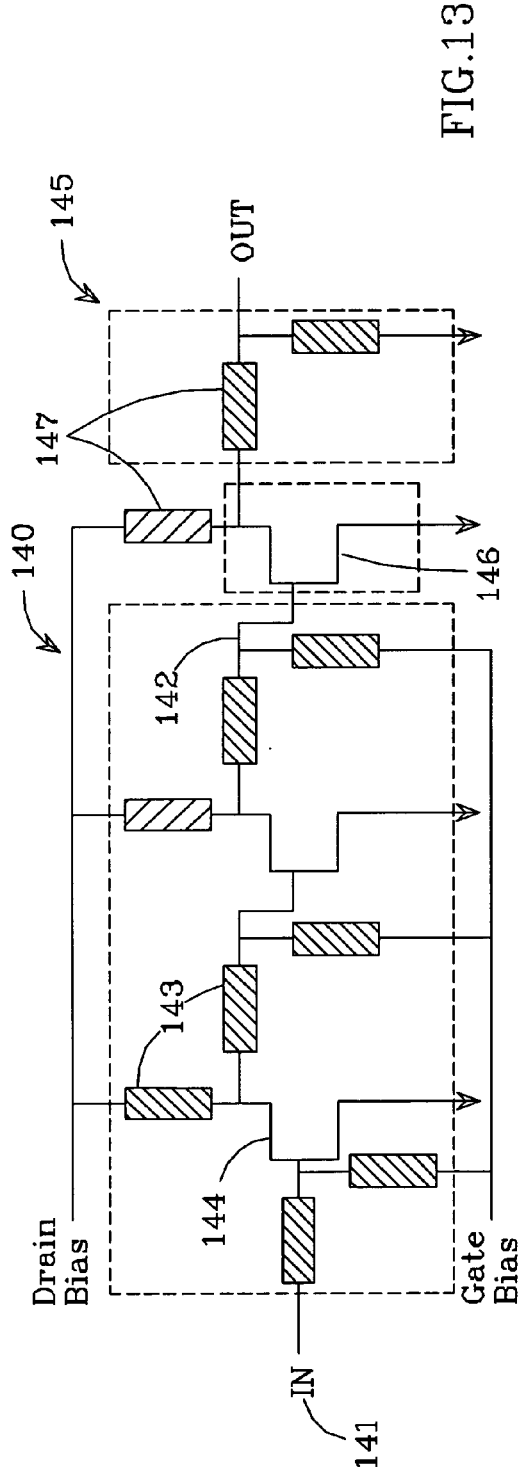
FIG. 13 is a schematic diagram of a multistage amplifier.

The flip-chip integrated circuits described may be used to implement various types of circuitry including RF, microwave and mmwave power amplifiers. FIG. 13 is a general schematic of an amplifier circuit including various amplifier electronics that form a multistage preamplifier section 140 having an input 141 and an output 142. While the preamplifier section 140 includes two amplifiers connected in series, additional preamplifiers and/or other circuit components may be included. Each preamplifier includes one or more passive circuit elements 143 interconnected with a transistor 144. The amplifier circuit also includes an output stage amplifier 145 which also includes a transistor 146 and passive circuit elements 147. The output 142 of the multistage preamplifier 140 is input to the output stage amplifier 145. In accordance with the present invention, the components of the multistage preamplifier section, i.e., the active transistors 144 and passive circuit elements 143, and the passive components 147 of the output stage amplifier 145 may be included in a circuit substrate while the active transistor 146 of the output stage amplifier may be separately formed and flip-chip mounted on the circuit substrate.

Figure 14:
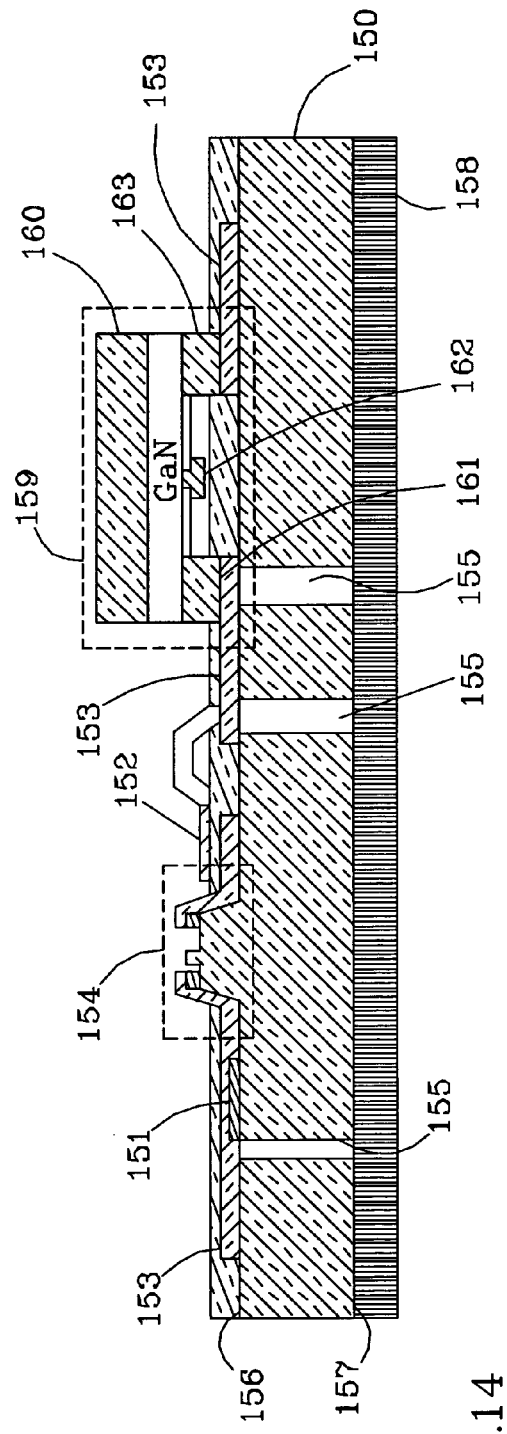
FIG. 14 is a sectional view of an integrated circuit according to the present invention including some of the components of the amplifier circuitry of FIG. 13.

FIG. 14 shows an example of an integrated circuit assembly that realizes aspects of the schematic of FIG. 13. To preserve clarity of illustration only some of the components of FIG. 13 are shown in FIG. 14. Where applicable, correlation between the two figures is provided in the following description of FIG. 14 by parenthetical reference to elements of FIG. 13.

The assembly includes a circuit substrate 150 with passive circuit elements including a resistor 151 (FIG. 13, 143) and a capacitor 152 (143), interconnections 153 and an active transistor 154 (FIG. 13, 144), formed thereon. The circuit substrate 150 may be designed and fabricated in a foundry process including front side processes, e.g., active transistors, passive circuit elements like transmission lines, resistors, capacitors etc., and backside processes, e.g., via holes and ground plane. In a preferred embodiment, the circuit substrate 150 is a GaAs based substrate and the transistor 154 is a GaAs transistor. In other configurations, the circuit substrate 150 may be a Si based, SiC based, InP based, AlN based or ceramic based substrate. The circuit substrate 150 may include the pre-amplifier 140 or driver stage of the amplifier circuit of FIG. 13.

With continued reference to FIG. 14, the substrate 150 includes conductive vias 155 that connect a first surface 156 of the circuit substrate with a second surface 157 of the substrate. A conductive structure 158, such as a ground plane, is adjacent the second surface 157 and in electrical connection with the vias 155. The ground plane 158 provides the ground connections required by the passive circuit elements 151, 152 and the transistors 154 forming the multistage preamplifier section. In an alternate configuration, the ground connection may be provided by an interconnection, or trace, on the first surface 156 of the circuit substrate. Such a configuration, sometimes referred to as a "coplanar waveguide" configuration, essentially eliminates the need for conductive vias 155.

With continued reference to FIG. 14, the assembly also includes a flip-chip mounted transistor 159 (FIG. 13, 146) that is fabricated separately on a suitable substrate 160 such as SiC. In a preferred embodiment, the transistor 159 is Group III nitride transistor such as a GaN HEMT configured as shown and described previously with reference to FIG. 4. The transistor 159 is mounted at the outputs stage of the circuit fabricated on the circuit substrate. In particular, the transistor 159 is mounted such that the source contact 161 is electrically connected to the ground plane 158 through a conductive via 155, the gate contact 162 is connected to the output of the prestage amplifier section (not shown) (FIG. 13, 142) and the drain contact 163 is connected to passive circuit elements (not shown) (FIG. 13, 147) on the circuit substrate. The transistor 159, in combination with the passive circuit elements, forms a "flip-chip" amplifier.

The use of a GaN HEMT based amplifier at the output stage can provide greater than 10 times the output power compared to that available from an equivalent GaAs output stage. The flip-chip process takes advantage of the fact that the rest of the circuit, including GaAs amplifier before the output stage, interstage matching, and circuit environment, is all completed in a commercial process on large area substrates. An integrated circuit configured as such allows for the heterogeneous integration of multiple semiconductor technologies. For example, such a circuit may utilize a commercial lower cost GaAs MMIC multistage preamplifier and a high output stage GaN HEMT amplifier to provide a circuit having an increased total power output.

In addition to RF and microwave circuits, the flip-chip integrated circuits described may be used in the area of power electronic circuits. Typical power electronic circuits, such as power converters, inverters and switching circuits, are implemented with Si based electronics. Also power electronic circuits typically utilize extensive control circuits that are most easily and economically implemented with Si CMOS. These control circuits provide appropriate signals and synchronization to various high power elements such as switching transistors. In accordance with the present invention, a GaN HEMT power switching transistor may be used in conjunction with the Si based electronics to provide a circuit having an extremely high breakdown voltage (provided by the Group III nitride transistor), high mobility and very low ON resistance.

FIG. 15 is a general schematic of a power electronics circuit including a switching device 170, e.g., transistor, a gate control circuit 171 and a drain control circuit 172. In accordance with the present invention, the components of the control circuits 171, 172, e.g., logic circuits, may be included in a circuit substrate while the switching device, i.e., active transistor 170 may be separately formed and flip-chip mounted on the circuit substrate.

FIG. 16 shows an example of an integrated circuit assembly that realizes aspects of the schematic of FIG. 15. To preserve clarity of illustration only some of the components of FIG. 15 are shown in FIG. 16. Where applicable, correlation between the two figures is provided in the following description of FIG. 16 by parenthetical reference to elements of FIG. 15.

The assembly includes a circuit substrate 180 having passive circuit elements including a resistor 181 and a capacitor 182, interconnections 183 and logic circuitry 184 formed thereon. In a preferred embodiment, the circuit substrate 180 is a Si based substrate and the logic circuitry 184 is Si logic. In other configurations, the circuit substrate 180 and logic circuitry 184 may be formed using a different semiconductor material, such as, SiC. The substrate 180 includes conductive vias 185 that connect a first surface 186 of the circuit substrate with a second surface 187 of the substrate. A conductive structure 188, such as a ground plane, is adjacent the second surface 187 and in electrical connection with the vias 185. The ground plane 188 provides the ground connections required by the passive circuit elements 181, 182 and logic circuitry 184. Alternatively, the circuit substrate 180 may have a coplanar waveguide configuration, as previous described.

With continued reference to FIG. 16, the assembly also includes a flip-chip mounted transistor 189 (FIG. 15, 170) that is fabricated separately on a suitable substrate 190 such as SiC. In a preferred embodiment, the transistor 189 is a GaN HEMT configured as shown and described previously with reference to FIG. 4. In other configurations, the transistor 189 may be formed from other Group III nitrides or SiC. The transistor 189 is mounted such that the source contact 191 is electrically connected to the ground plane 188 through a conductive via 185, the gate contact 192 is connected to the output of the gate control circuit (not shown) (FIG. 15, 171) on the circuit substrate and the drain contact 193 is connected to output of the drain control circuit (not shown) (FIG. 15, 172), also on the circuit substrate. In an alternate configuration, the transistor 189 may be hardwired to the circuit substrate, as opposed to being flip-chip mounted.

Although the present invention has been described in considerable detail with reference to certain preferred configurations thereof, other versions are possible. The sequence of the steps in the methods described above can be different. Other methods according to the invention can use more or less steps and can use different steps. All embodiments described above can be used with circuit substrates with or without pre-stage amplifiers and with or without via plugs. Many different types of integrated circuits made of many different materials can be flip-chip mounted according to the invention.

Therefore, the spirit and scope of the claims should not be limited to the versions on the invention described in the specification.

We claim:

1. A flip-chip integrated circuit comprising:
   a circuit substrate having a transistor component and a plurality of passive circuit elements on a first surface, wherein said transistor component is integral to said circuit substrate to form an active device connected to function in an amplifier circuit; and
   an active semiconductor device comprising a substrate distinct from said circuit substrate, said active semiconductor device comprising layers of semiconductor material and a plurality of terminals, each of the terminals in electrical contact with one of the layers of semiconductor material, said active semiconductor device flip-chip mounted on said first surface of the circuit substrate, at least one of the terminals electrically connected to the transistor component on the circuit substrate.

2. The circuit of claim 1, wherein the electrical connection between the active semiconductor device and the transistor component on the circuit substrate is through at least one of the passive components.

3. The circuit of claim 1, wherein the transistor component, in combination with passive components on the circuit substrate, forms an amplifier.

4. The circuit of claim 1, wherein the active semiconductor device comprises a transistor.

5. The circuit of claim 4, wherein the transistor, in combination with passive components on the circuit substrate, form an amplifier.

6. The circuit of claim 1, wherein the layers of material comprise a substrate and an active layer.

7. The circuit of claim 6, wherein the material of the substrate is Group III nitride based, silicon based, silicon carbide based, sapphire based, aluminum nitride based or gallium nitride based.

8. The circuit of claim 6, wherein the material of the active layer is Group III nitride based, silicon based or silicon carbide based.

9. The circuit of claim 1, wherein the circuit substrate comprises a substrate material that is gallium arsenide based, silicon based, silicon carbide based, indium phosphide based, aluminum nitride based or ceramic based.

10. The circuit of claim 1, wherein the circuit substrate includes a second surface opposite the first surface and conductive vias through the circuit substrate and in electrical connection with at least one of the transistor component, passive circuit elements or terminals at the first surface and a conductive structure on the second surface.

11. The circuit of claim 10, wherein the conductive structure functions as a ground connect.

12. The circuit of claim 10, wherein the first surface further comprises an interconnection in electrical connection with at least one of the transistor component, passive circuit elements or terminals on the first surface.

13. The circuit of claim 12, wherein the interconnection functions as a ground connect.

14. A flip-chip integrated circuit comprising:
    a circuit substrate having amplifier electronics and passive circuit elements on a first surface, wherein said amplifier electronics are integral to said circuit substrate to form an amplifier device; and
    a semiconductor transistor comprising a substrate distinct from said circuit substrate, said semiconductor transistor flip-chip mounted on said first surface of the circuit substrate and in electrical connection with passive circuit elements on the first surface, said semiconductor transistor forming a flip-chip amplifier in combination with said passive circuit elements, said flip-chip amplifier having an input electrically connected to the amplifier electronics.

15. The circuit of claim 14, wherein the amplifier electronics comprise a multi-stage amplifier having an output electrically connected to the flip-chip amplifier.

16. The circuit of claim 14, wherein the semiconductor transistor comprises a substrate layer and an active layer.

17. The circuit of claim 16, wherein the material of the substrate layer is group III nitride based, silicon based, silicon carbide based, sapphire based, aluminum nitride based or gallium nitride based.

18. The circuit of claim 16, wherein the material of the active layer is Group III nitride based, silicon based or silicon carbide based.

19. The circuit of claim 14, wherein the semiconductor transistor is a Group-III nitride HEMT.

* * * * *